(12) United States Patent
Lehmann et al.

(10) Patent No.: US 7,457,143 B2
(45) Date of Patent: Nov. 25, 2008

(54) MEMORY DEVICE WITH SHARED REFERENCE AND METHOD

(75) Inventors: Gunther Lehmann, Holzkirchen (DE); Siddharth Gupta, Bangalore (IN); Devesh Dwivedi, Bangalore (IN)

(73) Assignee: Infineon Technologies AG, Munich (DE)

( * ) Notice: Subject to any disclaimer, the term of this patent is extended or adjusted under 35 U.S.C. 154(b) by 90 days.

(21) Appl. No.: 11/410,432

(22) Filed: Apr. 25, 2006

(65) Prior Publication Data
US 2007/0247954 A1    Oct. 25, 2007

(51) Int. Cl.
G11C 17/00    (2006.01)
(52) U.S. Cl. .................. 365/94; 365/63; 365/189.02; 365/189.09; 365/230.03
(58) Field of Classification Search .............. 365/63, 365/94, 189.02, 189.09, 210, 230.03
See application file for complete search history.

(56) References Cited

U.S. PATENT DOCUMENTS

| | | | | |
|---|---|---|---|---|
| 5,812,461 A | | 9/1998 | Komarek et al. ....... 365/189.02 |
| 6,031,759 A | * | 2/2000 | Ohashi ..................... 365/185.2 |
| 6,075,722 A | * | 6/2000 | Hibino ........................ 365/168 |
| 6,862,232 B2 | * | 3/2005 | Hanzawa et al. ............. 365/200 |
| 7,277,339 B2 | * | 10/2007 | Edahiro ...................... 365/203 |
| 2001/0053107 A1 | | 12/2001 | Kohno ................... 365/230.06 |
| 2004/0151045 A1 | | 8/2004 | Kanai ......................... 365/203 |

FOREIGN PATENT DOCUMENTS

WO    WO 2006/024403    3/2006

OTHER PUBLICATIONS

B.D. Yang, L.S. Kim, "A Low-Power ROM Using Charge Recycling and Charge Sharing Techniques", IEEE Journal of Solid-State Circuits, vol. 38, No. 4, Apr. 2003, pp. 641-653.

* cited by examiner

*Primary Examiner*—Hoai V Ho
(74) *Attorney, Agent, or Firm*—Davidson, Davidson & Kappel, LLC

(57) ABSTRACT

A memory device has a first core memory array, a second core memory array, a third core memory array and a fourth core memory array, and a first common reference section for the first core memory array and the second core memory array, and a second common reference section for the third core memory array and the fourth core memory array. Another memory device with shared signals and a method is also provided.

10 Claims, 5 Drawing Sheets

MEMORY DEVICE WITH SHARED REFERENCE AND METHOD

BACKGROUND OF THE INVENTION

The present invention relates to memory devices such as ROMs, MRAMs, FeRAMs, flash memory and the like.

FIG. 1 shows a prior art memory device with individual reference sections 10, 12, 13, 14 for each core memory array 20, 22, 23, 24, respectively. Each core array 20, 22, 23, 24 may be a ROM core array having a plurality of bit lines 127 and word lines 121, the bit lines for each core array being connected to a respective multiplexer 30, 32, 33, 34 which receives column decoding signals Y0 to YM-1 and a reference signal YREF. Each core array can receive a virtual operating voltage VDD (VVDD) via a power line called a VVDD line for each column of the memory core. Upon selection of the bit line for reading out, the VVDD line is charged from a reference potential to an operating voltage VDD. The reference sections 10, 12, 13, 14 each have a bit line reference BLREF 19 and virtual VDD reference VVDDREF 18 for a respective core array. If the memory is organized in words of N bits, for example 16 bits, then for each bit output, both VVDDREF and VVDD are switched from a reference potential VSS to an operating voltage VDD. During a read operation, a bit line reference BLREF can then be used with the bit line output BL of the respective core array 20 to read the bit line output BL.

Each multiplexer 30, 32 has part of a circuitry delegated for the activation or selection of a reference column, the circuitry called a reference mulitplexer 35, 36. At the output of each bitline multiplexer 30, 32 is a respective selection/deselection logic circuit 40, 42, each providing a reference signal DLREF from the reference mux and a multiplexer output signal DL to a respective sense amplifier 50, 52.

WO2006/024403 A1 discloses a ROM memory circuit, and is hereby incorporated by reference herein.

The article "A Low Power ROM Using a Single Charge Sharing Capacitor" by Byung-Do Yang and Lee-Sup Kim shows a ROM memory circuit and is hereby incorporated by reference herein.

BRIEF SUMMARY OF THE INVENTION

The present invention provides a memory device comprising a first core memory array, a second core memory array, a third core memory array and a fourth core memory array, and a first common reference section for the first core memory array and the second core memory array, and a second common reference section for the third core memory array and the fourth core memory array.

The present invention also provides a memory device comprising a first core memory array, a first multiplexer connected to the first core memory array and having a first bitline mux output, a first sense amplifier receiving the first bitline mux output, a second core memory array, a second multiplexer connected to the second core memory array and having a second bitline mux output, a second sense amplifier receiving the second bitline mux output, and a reference multiplexer section providing a common bitline reference for use with the first and second bitline mux outputs.

The present invention also provides a method for operating a memory device comprising:

multiplexing a first core memory array using a bit line output signal and a bit line reference signal;

multiplexing a second core memory array using a second bit line output signal and the bit line reference signal;

multiplexing a third core memory array using a third bit line output signal and a second bit line reference signal; and multiplexing a fourth core memory array using a fourth bit line output signal and the second bit line reference signal.

BRIEF DESCRIPTION OF THE SEVERAL VIEWS OF THE DRAWING(S)

FIG. 1 shows a prior art memory device as described above.

The present invention will be further described with reference to preferred embodiments, in which.

DETAILED DESCRIPTION OF THE INVENTION

Figure 1:
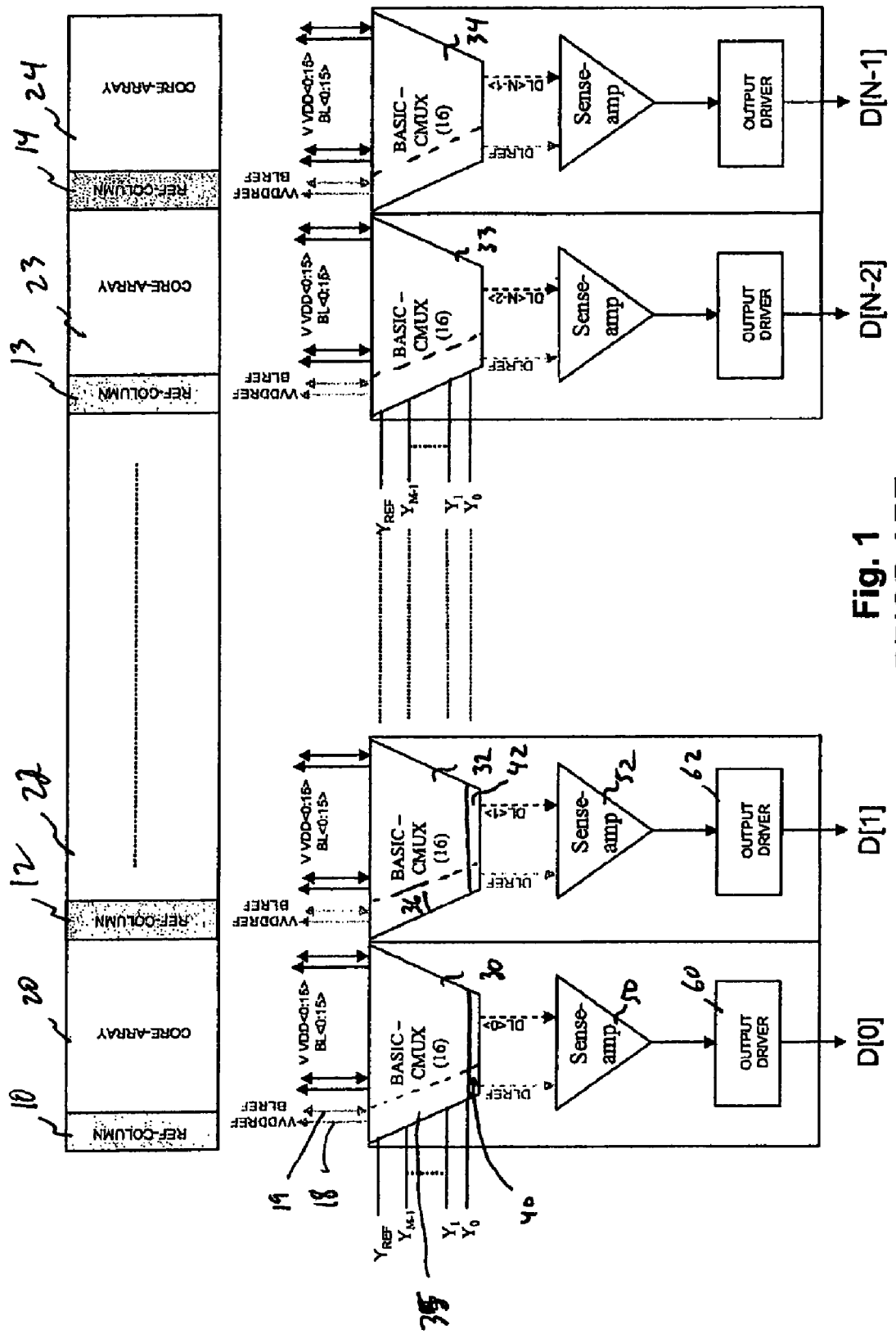
Figure 2:
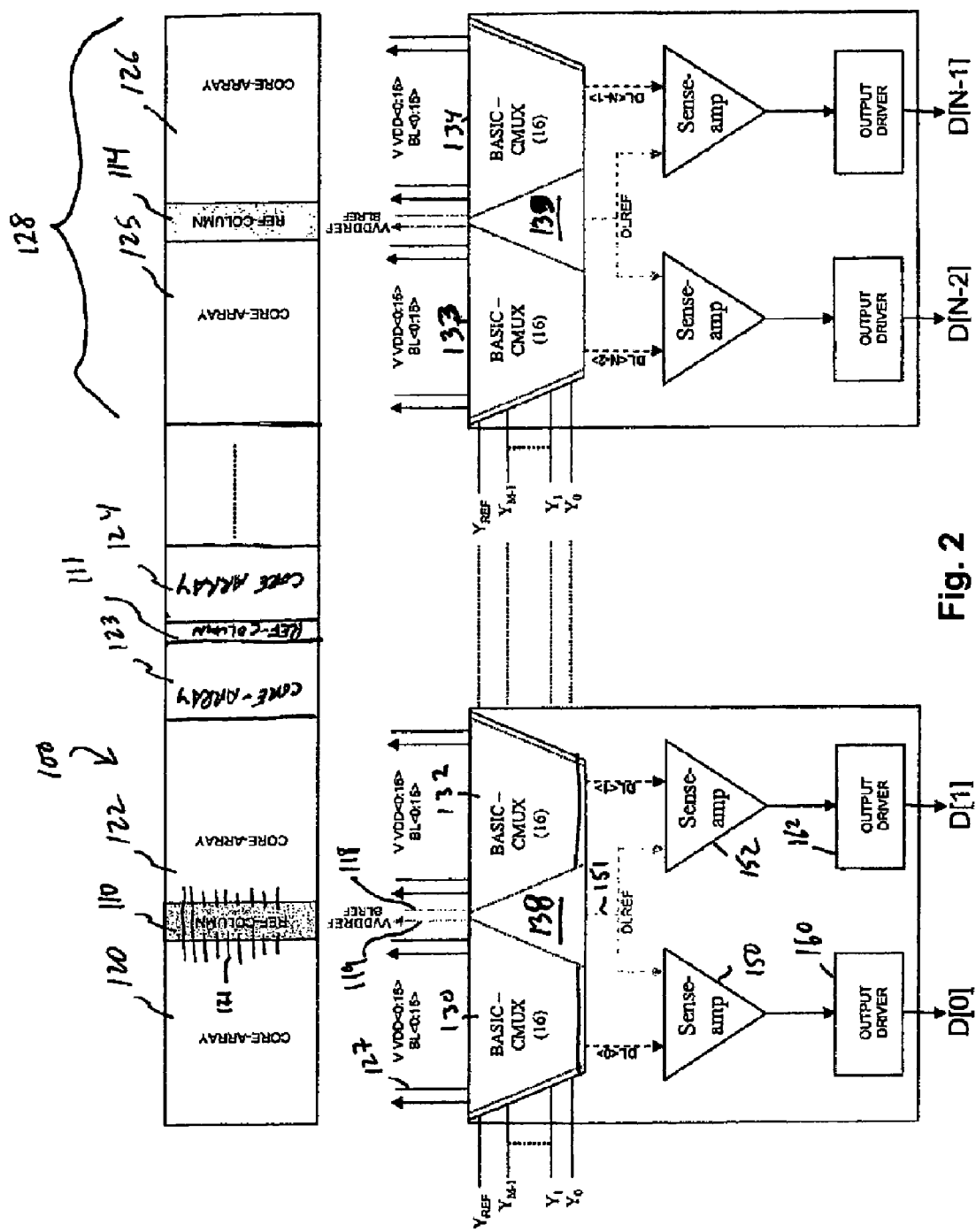
FIG. 2 shows schematically one embodiment of a memory device of the present invention.

FIG. 2 shows schematically one preferred ROM embodiment of a memory device 100 of the present invention.

A plurality of ROM core arrays 120, 122, 123, 124, 125, 126, etc are provided. Between each pair of core arrays 120, 122 and 123, 124 and 125, 126 is a reference section 110, 111, 114 respectively having a same number of word lines as the neighboring core arrays. Between core arrays 122 and 123 of neighboring core array pairs, no reference column is provided. Each core pair thus has a single reference section, and defines a shared reference core array pair 128.

Each reference section 110, 111, 114 thus receives a VVDDREF voltage signal and provides a BLREF bit line reference signal for use with the multiplexers and signal amplifiers of its respective core array pair 120, 122, and 123, 124 and 125, 126 as will be described.

This core array pair structure with one reference section provides several advantages: (1) the scheme reduces dynamic power since the switching power of the highly capacitive VVDDREF and BLREF lines is reduced in half; (2) the array area is reduced by sharing the reference section; (3) the reference section at the MUX level and selection/deselection logic circuit and reference signals for the sense amplifiers can be shared more easily as will be described.

In addition, by forming the shared reference core array pairs, global reference signals for all of the core arrays 120, 122, 124, 126 are avoided. The present structure thus provides the bit line reference signal generation right next to the core arrays using the reference signals for multiplexing and thus avoid bit-cell and parasitic process disadvantages associated with global reference signals, which can make memory compilation difficult. In other words, there is better tracking of reference voltages over a compiler range than with a global reference voltage for all memory core arrays.

The multiplexers 130, 132 for the core arrays 120, 122 respectively then also can have a shared reference multiplexer section 138 connected to the reference section 110 via a VVDDREF signal line 119 and BLREF signal line 118. This shared reference multiplexer section 138 can track its output to a respective data line output DL for a bit line from each multiplexer 130, 132, and thus provides the data line DLREF signal 151 for use with the DL output signals from each of the multiplexers 130, 132. The DLREF signal can then be used by sense amplifiers 150, 152, each of which uses one of the output bit line signals DL of the multiplexers 130, 132, to better determine bit line voltage swings and read the memory array. Were the DLREF signal to come from a global source, possibly physically away from the memory array, parasitic variations such as delays caused by the distance, would make close tracking of the DLREF signal and DL signals more difficult.

Figure 3:
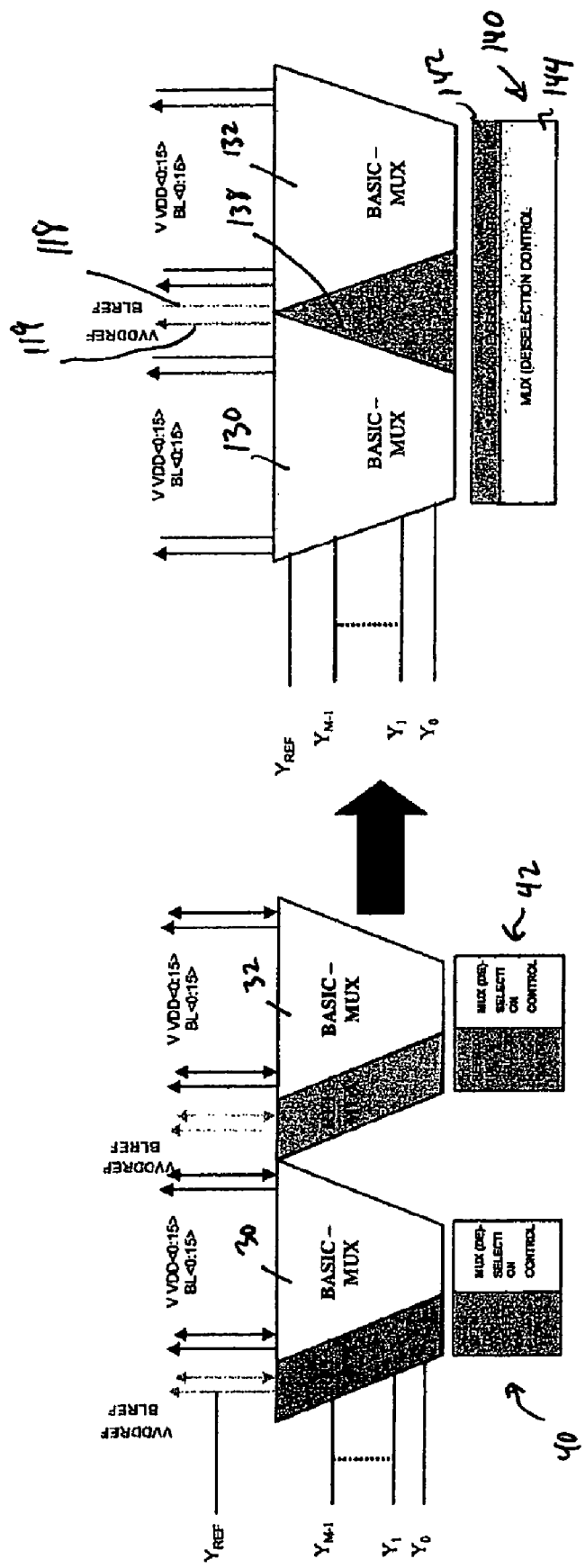
FIG. 3 shows the differences between the prior art multiplexer section and the multiplexer section of the FIG. 2 embodiment.
Figure 4:
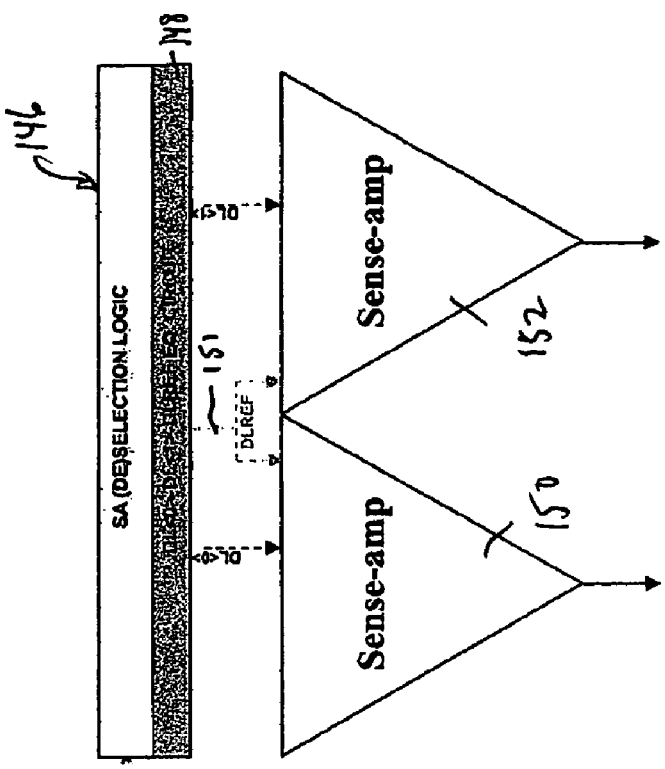
FIG. 4 shows the differences between the prior art selection logic circuit and sense amplifier section and that of the FIG. 2 embodiment.
Figure 4:
Figure 4:
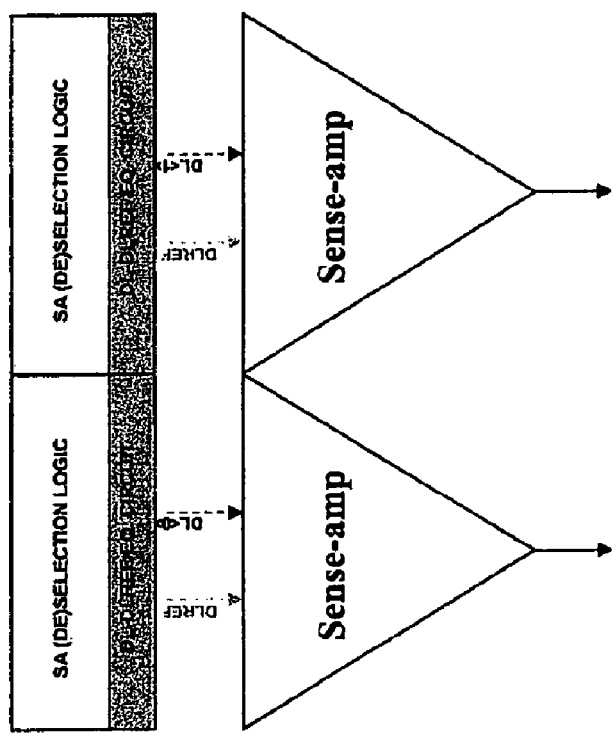

FIGS. 3 and 4 show the differences between the prior art multiplexer sections 30, 32, 40, 42 and the multiplexer sections of the FIG. 2 embodiment. The reference multiplexer 138 has a multiplexer (de)selection control section 140 which includes a reference multiplexer (de)selection control and a multiplexer (de)selection control 144 for each multiplexer 130, 132 which selects each bit line.

A sense amplifier selection/deselection logic 146 as shown in FIG. 4 receives bitline signals from multiplexers to provide the bit line data DL and a common DLREF signal to the sense amps 150, 152. In a DL-DLREF voltage equalization circuit 148, the voltages for each data node Dl<0> from multiplexer 130, DL<1> from multiplexer 132 and DLREF from reference mux 138 are equalized. The DL<0> and DLREF signals are then sent to the sense amplifier 150, and the DL<1> and DLREF signals are sent to sense amplifier 152. The sense amplifiers 150, 152 are activated to sense the data line data and provide a digital output.

Figure 5:
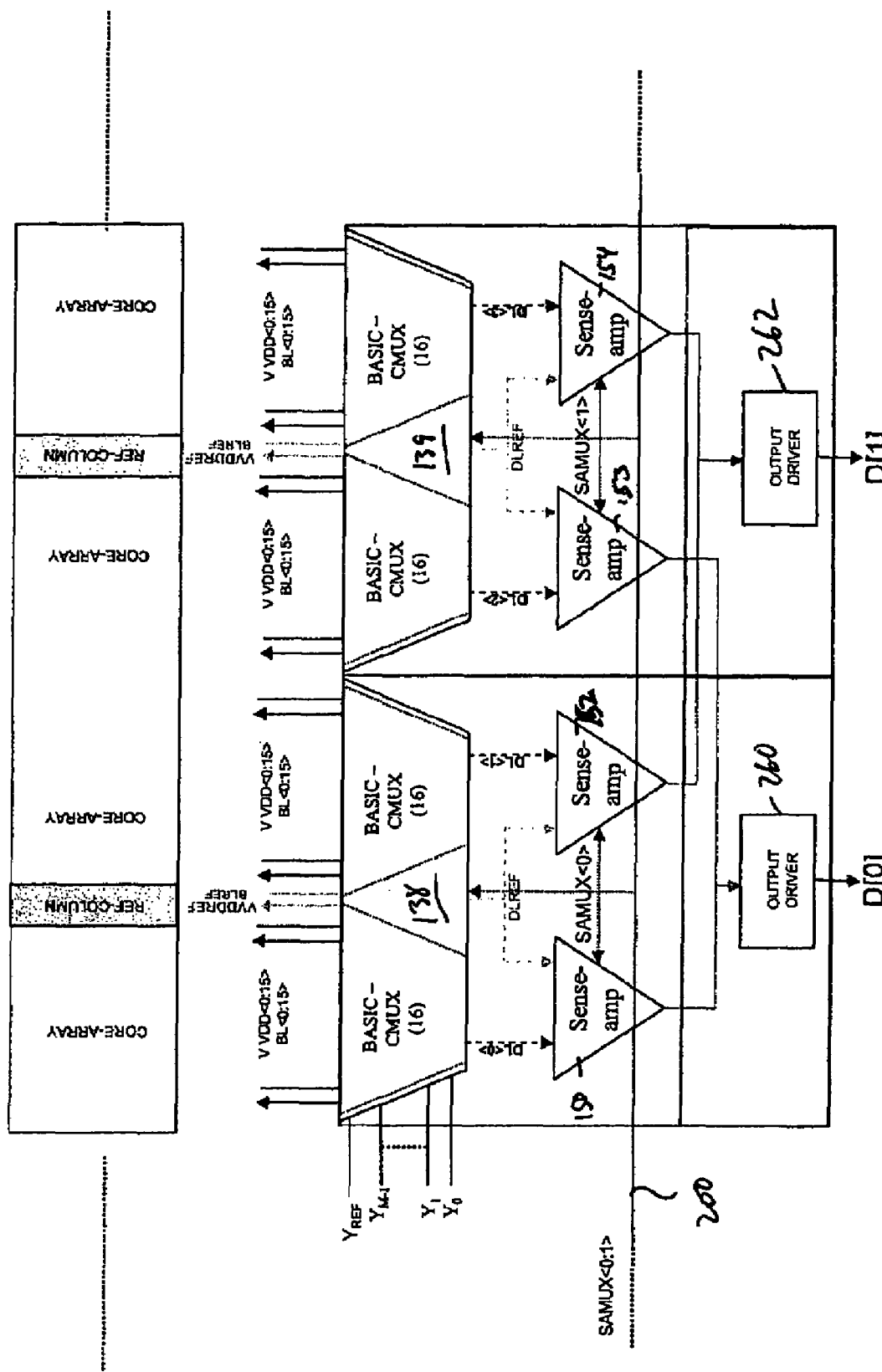
FIG. 5 shows a further embodiment where sense amplifier outputs are fed to a common output driver.

FIG. 5 shows a further embodiment where sense amplifier outputs are fed to a common output driver, and a sense amplifier multiplexer 200 is provided to provide a signal to the shared reference multiplexer sections 138, 139. This can halve the number of output drivers 260, 262. Sense amplifier 150 or sense amplifier 153 can output through driver 260, and sense amplifier 152 or sense amplifier 154 can output through driver 262. If SAMUX <0> is activated the sense amps 150, 152 provide output signals through the output drivers 260, 262, and if SAMUX <1> is activated, the sense amps 153, 154 provide signals through output drivers 260, 262. Thus for example a thirty-two bit multiplexing capability twice that of a basic sixteen bit multiplexer can be provided.

The core memory arrays have a plurality of ROM storage transistor cells which can be set to a logical one or logical zero, typically by connecting or not connecting, respectively, a drain line of the transistor to one of the bit lines. When the VVDD is set to a voltage VDD, a voltage appears at the source line of the transistor as well as at a word line connected to a gate of the transistor, so that the certain time thereafter a voltage or no voltage appears on the bit line depending on the logical value of the transistor cell. By multiplexing each column, each cell can be read out. To aid in reading the bit line voltage, the multiplexer shared reference 138 can send, at the same time as the VVDD, a VVDDREF signal to the reference or dummy section 110 which can for example have of all logical one or all logical zero cells or combination of logical zeros and ones to provide a bit line reference BLREF which can be used by each multiplexer 130, 132 to provide a signal to a sense amp for sensing.

While the present invention has been described with reference to an ROM memory device, the present invention may be applicable to other memory devices such as MRAMs, FeRAMS or flash memories and is especially beneficial for embedded memories designed for different sizes.

What is claimed is:

1. A memory device comprising:
 a first core memory array,
 a second core memory array,
 a third core memory array,
 a fourth core memory array, and
 a first common reference section for the first core array and the second core array, the first common reference section having a single bit line reference for both the first and second core arrays, and
 a second common reference section for the third core array and the fourth core array.

2. The memory device as recited in claim 1 wherein the first core memory array is a ROM memory array.

3. The memory device as recited in claim 1 wherein the first and second memory arrays and first common reference section have a same number of word lines.

4. The memory device as recited in claim 1 wherein the first reference section has a first reference bit line output, and the second reference section has a second reference bit line output.

5. The memory device as recited in claim 1 further comprising a first multiplexer for the first core memory array, a second multiplexer for the second core memory array and a first common multiplexer reference section for the first and second multiplexers, the first common multiplexer reference section providing a reference data line output to the sense amplifiers.

6. The memory device as recited in claim 5 further comprising a third multiplexer for the third core memory array, a fourth multiplexer for the fourth core memory array and a second common multiplexer reference section providing a second reference data line output to the sense amplifiers.

7. The memory device as recited in claim 6 further comprising a first sense amplifier for the first multiplexer and a second sense amplifier for the second multiplexer, the first common multiplexer reference section providing a common reference signal for signals sent to the first and second sense amplifiers.

8. The memory device as recited in claim 7 further comprising a third sense amplifier for the third multiplexer and a fourth sense amplifier for the fourth multiplexer, the second common multiplexer reference section providing a common digital reference signal for signals sent to the third and fourth sense amplifiers.

9. The memory device as recited in claim 8 further comprising a sense amplifier multiplexer connected to the first, second, third and fourth sense amplifiers, and two output drivers each connected to two of the first, second, third and fourth sense amplifiers.

10. A memory device comprising:
 a first core memory array,
 a second core memory array,
 a third core memory array,
 a fourth core memory array, and
 a first common reference section for the first core array and the second core array,
 a second common reference section for the third core array and the fourth core array,
 a first multiplexer for the first core memory array, a second multiplexer for the second core memory array and a first common multiplexer reference section for the first and second multiplexers, the first common multiplexer reference section providing a reference data line output;
 a third multiplexer for the third core memory array, a fourth multiplexer for the fourth core memory array and a second common multiplexer reference section providing a second reference data line output;
 a first sense amplifier for the first multiplexer and a second sense amplifier for the second multiplexer, the first common multiplexer reference section providing a common data line reference signal for signals sent to the first and second sense amplifiers, a third sense amplifier for the third multiplexer and a fourth sense amplifier for the fourth multiplexer, the second common multiplexer reference section providing a common data line reference signal for signals sent to the third and fourth sense amplifiers; and a sense amplifier multiplexer connected to the first, second, third and fourth sense amplifiers, and two output drivers each connected to two of the first, second, third and fourth sense amplifiers.

* * * * *